United States Patent [19]

Kim

[11] Patent Number: 5,706,245

[45] Date of Patent: Jan. 6, 1998

[54] WORD LINE DECODING CIRCUIT OF A SEMICONDUCTOR MEMORY DEVICE

[75] Inventor: Hyeun-Su Kim, Suwon, Rep. of Korea

[73] Assignee: Samsung Electronics Co., Ltd., Rep. of Korea

[21] Appl. No.: 573,967

[22] Filed: Dec. 15, 1995

[30] Foreign Application Priority Data

Dec. 15, 1994 [KR] Rep. of Korea ............... 34354/1994

[51] Int. Cl.$^6$ ............................................. G11C 7/00
[52] U.S. Cl. ........................... 365/230.06; 365/230.03; 365/63
[58] Field of Search ............... 365/230.06, 230.03, 365/230.01, 63, 51, 189.08

[56] References Cited

U.S. PATENT DOCUMENTS

| | | | |
|---|---|---|---|
| 4,827,449 | 5/1989 | Inoue | 365/63 |
| 5,140,550 | 8/1992 | Miyaoka et al. | 365/63 |
| 5,214,606 | 5/1993 | Hashimoto | 365/230.06 |
| 5,416,748 | 5/1995 | Fujita | 365/230.06 |

OTHER PUBLICATIONS

Noda, K. et al., "A Boosted Dual Word-line Decoding Scheme for 256Mb DRAMs", *Symposium on VLSI Circuits Digest of Technical Papers*, pp. 112–113 (1992).

*Primary Examiner*—David C. Nelms
*Assistant Examiner*—Vu A. Le
*Attorney, Agent, or Firm*—Cushman Darby & Cushman IP Group of Pillsbury Madison & Sutro LLP

[57] ABSTRACT

The present invention includes a plurality of memory cells store information and one row decoder for every four word lines to decode an external address output a single row decoding signal. A word drive decoder generates a word line driving signal. A split word line driver arranged such that the memory cell array is formed between each split word line driver, inputs the single row decoding signal output from the row decoder and the word line driving signal output from the word drive decoder to thereby output a word line signal to select appropriate memory cells. With this structure, the reduced number of metalized lines requiring straps which overlay the memory cell array help minimize short-circuit problems that would otherwise occur when dimensions of metalized lines are reduced.

13 Claims, 4 Drawing Sheets

WORD LINE DECODING CIRCUIT OF A SEMICONDUCTOR MEMORY DEVICE

BACKGROUND OF THE INVENTION

The present invention relates to a word line decoding circuit of a highly integrated semiconductor memory device, and more particularly, to a word line decoding circuit having a single row decoding line.

Generally, high integration of a semiconductor memory device depends on the size of its memory cell. One type of typical memory cell includes a single capacitor and a single transistor. In such a memory cell, the amount of charge that can be stored in the capacitor is proportioned to the size of the capacitor. As a result, as the size of the memory cell is reduced, the size of the capacitor is reduced and a proportional amount of charge that can be stored is reduced. It is difficult to store correct information as memory cells become reduced in size. Accordingly, research in this area is ongoing.

FIG. 1 is a block diagram illustrating a row decoding circuit of a general semiconductor memory device, and FIG. 2 is a circuit diagram illustrating the structure of a memory cell array of FIG. 1. FIG. 3 is a sectional view illustrating the memory cell array and the strap area, and FIG. 4 is a schematic view illustrating a general word line resistance.

In FIG. 1, in order to stably store information, the sectional areas of the capacitor electrodes have to be of sufficient size. However, in order to stably store information in a memory cell which becomes smaller in size in order to accommodate a high integration density, the sectional area of the capacitor is in many instances constructed in a three dimensional structure rather than in a two dimensional structure. Accordingly, such a memory cell has a higher height than that of the peripheral circuits also necessary to operate the memory device. As shown in FIG. 3, such different heights are generated where a word line end 1 and the edge of the memory cell array 2 meet. A polysilicon material having a high resistance forms part of the word line. Signal preparation through the polysilicon is comparatively slow, and creates time differences between memory cells at opposite ends of the polysilicon word line. In order to minimize this time difference and at the same time accelerate operating speed, resistance is typically reduced by using a metallic material having a small resistance over the memory cell and insulated from the polysilicon portion of the word line, and then the metallic material line is connected to the polysilicon portion of the word line using a "strap" as shown in FIG. 4. Accordingly, the word line is formed by the metallic material and the polysilicon material connected to each other using a strap in area 1 of FIGS. 1 and 3, as shown in an equivalent circuit of FIG. 4.

In a memory array as described above, since the number of metal lines is determined by the number of the word lines, thickness and spacing between the metal lines decreases as the size of the memory cell is reduced. When the thin and narrow metal lines run over the memory cell, the height of the metal line rapidly changes at edges of the memory cell where changes in height occur, thereby resulting in the metal line being short-circuited or bridged with an adjacent metal line. As a result, it is difficult for the metal pattern of the metal line to be formed in areas 4 of FIG. 3 due to height changes.

One method for enlarging the thickness and spacing of such metal lines by reducing their number in half is disclosed in a paper from "Symposium on VLSI Circuit Digest of Technical papers" published in 1992, pages 112–113, entitled "A Boosted Dual Word-line Decoding Scheme for 256 Mb DRAMs". As shown in FIG. 5, in this structure, the word line driver for driving the word line in the strap area 1 of FIG. 3 is divided into sub-word line drivers. Only a main word line having a decoding signal for selecting only a specific driver among the plurality of the word line drivers, illustrated as main word lines MWLO and MWLOB in FIG. 5 runs over the memory cell. Since the two main word lines MWLO and MWLOB are arranged at the same interval as the four word lines of FIG. 2, the number of the word lines is reduced by one half. In this way, short-circuiting of the metal line is reduced to some extent, but processing problems still exist.

Each of two main word lines MWLO and MWLOB is connected to a row decoder in which voltage levels are opposite each other. That is, if one line is at a boosted voltage $V_{BOOT}$ level, the other line becomes a ground-voltage $V_{SS}$ level. Accordingly, if the two lines are short-circuited with each other or adjacent lines, a large electrical current will flow from the boosted voltage $V_{BOOT}$ line to the ground-voltage $V_{SS}$ line.

As a result, even with redundancy memory cells provided for improving yield, the electrical current always flows and, therefore, it becomes impossible to use the memory elements associated with that line. If this problem is generated in even only one of the plurality of the signal lines, substantial limits to improving yield exist.

SUMMARY OF THE INVENTION

Accordingly, it is an object of the present invention to provide an improved word line decoding circuit.

It is another object of the present invention to provide a word line decoding circuit having a single row decoding signal which is arranged over a memory cell array for every four word lines to reduce the number of metalized lines over the memory cell array.

It is still another object of the present invention to provide a word line decoding circuit which assists in enlarging the thickness and spacing intervals of metal lines running over a memory cell array of the semiconductor memory device.

To achieve these and other objects of the present invention, a plurality of memory cells store information and one row decoder is used for every four word lines to decode an external address to output a single row decoding signal. A word drive decoder generates a word line driving signal. A split word line driver arranged such that the memory cell array is formed between each split word line driver, inputs the single row decoding signal output from the row decoder and the word line driving signal output from the word drive decoder to thereby output a word line signal to select appropriate memory cells.

With this structure, the reduced number of metalized lines requiring straps which overlay the memory cell array help minimize short-circuit problems that would otherwise occur when dimensions of metalized lines are reduced.

BRIEF DESCRIPTION OF THE DRAWINGS

A more complete appreciation of the invention, and many of the attendant advantages thereof, will be readily apparent as it becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
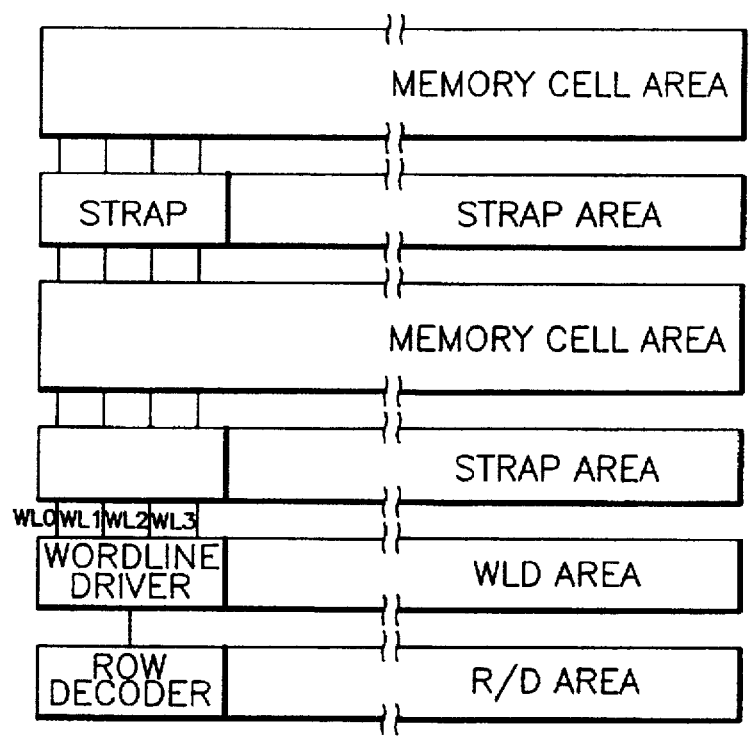
FIG. 1 is a block diagram illustrating an area layout of a conventional semiconductor memory device.
Figure 3:
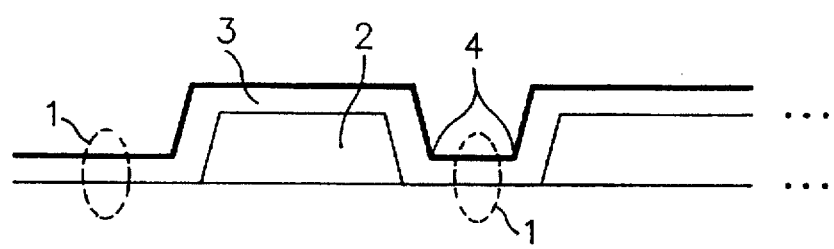
FIG. 3 is a sectional view illustrating the memory cell array and strap area of the FIG. 1 semiconductor memory device.
Figure 4:
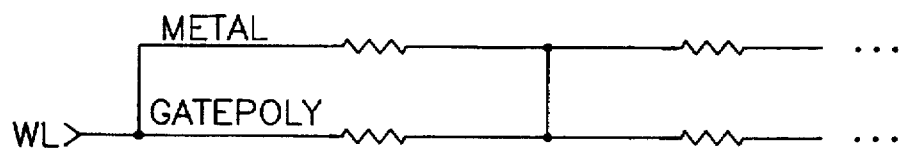
FIG. 4 is a schematic view of a word line using a strap to connect metal and polysilicon portions of the word line.
Figure 2:
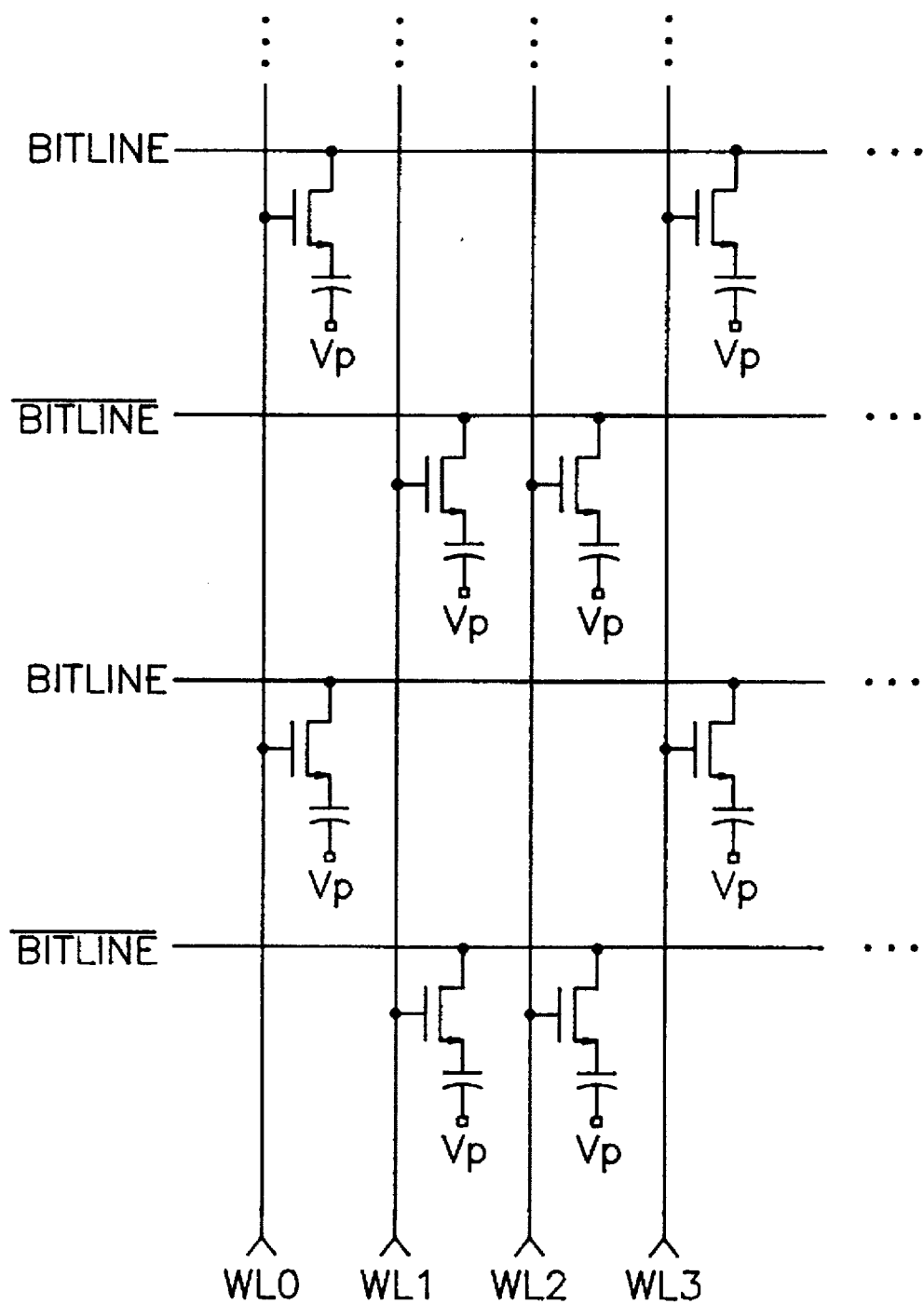
FIG. 2 is a circuit diagram illustrating a memory cell array of the FIG. 1 semiconductor memory device.
Figure 5:
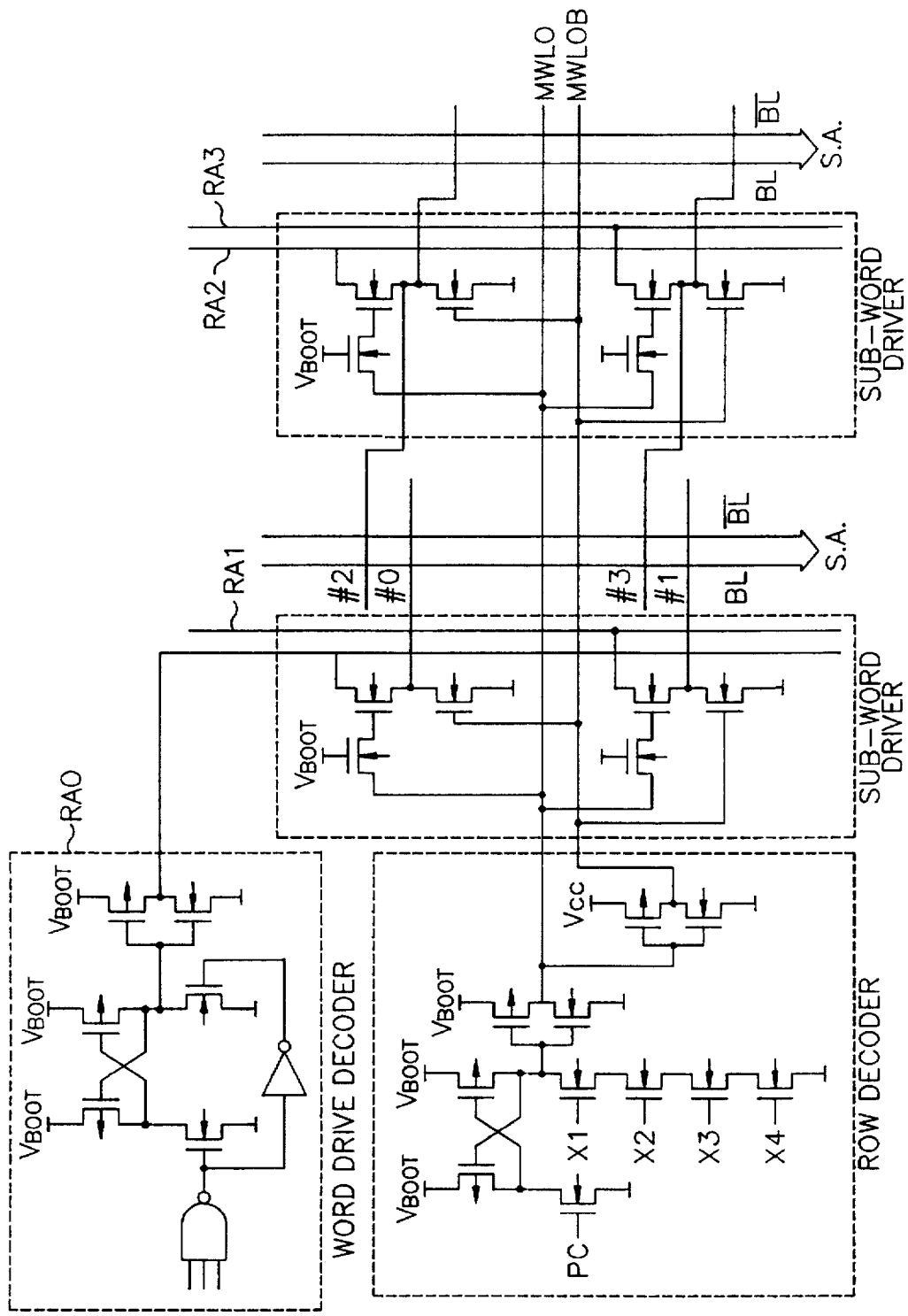
FIG. 5 is a circuit diagram illustrating conventional word line driver arrangement.
Figure 6:
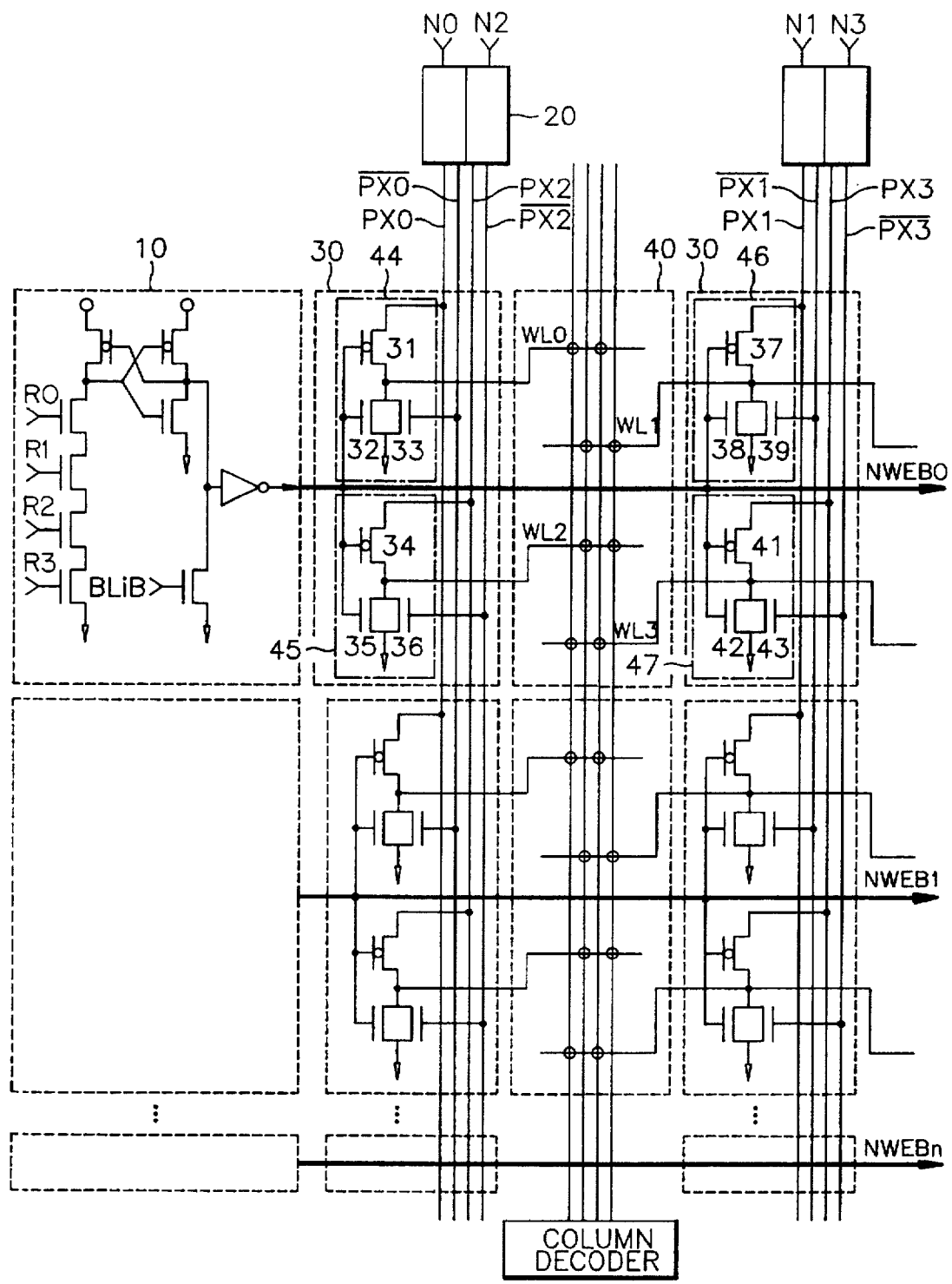
FIG. 6 is a circuit diagram illustrating the word line driver arrangement according to the present invention.

FIG. 6 is a circuit diagram illustrating the word line driver arrangement according to the present invention. A plurality of memory cells 40 store information and row decoders 10, are arranged one per every four word lines, for decoding an external address to thereby output a single row decoding signal. Word drive decoders 20 generate word line driving signals to a plurality of split word line drivers 30 arranged such that a plurality of memory cells 40 are between each split word line driver 30. In other words, the memory cells 40 are arranged between first and second groups of word line drivers.

Each row decoder 10 is associated with four word lines, each of which inputs a different decoding signal. Four split word drivers 44, 45, 46 and 47 are connected to the output line NWEB of one row decoder 10 and are arranged so that a memory cell array 40 is located between the split word line drivers. Each of every four split word drivers 44, 45, 46 and 47 contain one PMOS transistor 31, 34, 37 and 41, respectively, which input the row decoding signal output from the row decoder 10 to gate terminals thereof. Word line driving signals PX0, PX1, PX2 and PX3 are input to source terminals of each PMOS transistor 31, 34, 37 and 41, respectively. Each word line driver 44, 45, 46 and 47 also contain one NMOS transistor 32, 35, 38 and 42, respectively, which also input the row decoding signal output from the row decoder 10 to the gate terminals thereof, and the drain terminal of each NMOS transistor 32, 35, 38 and 42 is respectively connected to a drain terminal of the PMOS transistors 31, 34, 37 and 41. Each word line driver 44, 45, 46 and 47 also contain one NMOS transistor 33, 36, 39 and 43 having a drain terminal connected to a drain terminal of PMOS transistors 31, 34, 37 and 41. Word line driving signals $\overline{PX0}$, $\overline{PX1}$, $\overline{PX2}$ and $\overline{PX3}$ fare input to gate terminals thereof. Four word lines WL0, WL1, WL2 and WL3 extend from each split word line driver 30 over the memory cell array. Each word drive decoder 20 drives only one over the four split word line drivers 44, 45, 46 and 47 and is provided at a portion where the split word driver and sense-amplifier cross, (through the sense-amplifier, information is loaded via bit lines BL/$\overline{BL}$ when reading/writing information from/to each memory cell). An output terminal of each word drive decoder is connected to one of the split word drivers 44, 45, 46, and 47.

Each driver for driving one word line is arranged to face the strap area. As a result, each row decoder 10 has only a single decoding signal line arranged over the memory cell array as compared with the conventional two decoding signal lines for the same number of memory cells. As a result, short-circuits of the metal line and the bridge therebetween can be prevented while minimizing the number of the metal lines running over the memory cell array.

In operation, the word drive decoder 20 drives only one of four split word drivers, which each also receive the signal output from the row decoder 10 to thereby select one word line among the word lines WL0, WL1, WL2 and WL3, thus selecting one of the memory cells 40. Once a word line is selected, data can be written to and read from a memory cell 40. In order to select a word line, the row decoder 10 operates with signals R0, R1, R2, R3 and BLiB obtained from the external address signal. If a match occurs and a row decoder 10 is selected by the signals R0, R1, R2, R3 and BLiB, a logic "low" level signal is loaded to the output line NWEB0. At this time, a logic "high" level signal is loaded to output lines of non-selected row decoders.

The word drive decoder 20 generates the word line driving signals PX0, $\overline{PX0}$, PX1, $\overline{PX1}$, PX2, $\overline{PX2}$, PX3 and $\overline{PX3}$ by respective signals N0, N1, N2 and N3, which are obtained from address signals and thus are changed as signals R0, R1, R2 and R3 previously described. For example, if PX0 is selected the word line driving signals PX0 and $\overline{PX0}$ have a logic "high" level and a logic "low" level, respectively. Further, the logic "low" level is loaded to the non-selected driving signals PX1, PX2 and PX3, and the logic "high" level is loaded to the non-selected driving signals $\overline{PX1}$, $\overline{PX2}$, $\overline{PX3}$. The logic "low" level is loaded to the output line NWEB0 of the row decoder 10, so that the PMOS transistor 31 is turned ON to thereby output the word line driving signal PX0 of the logic "high" level to the word line WL0. If the logic "high" level signal is loaded to the word line WL0, the plurality of memory cells 40 connected to the word line WL0 are selected.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A word line decoding circuit of an integrated semiconductor memory device including a plurality of memory cells for storing information, said word line decoding circuit comprising:

a row decoder that decodes an external address and generates a single row decoding signal, said single row address signal being transmitted along an output line which contains a metallic portion and a strap, said output line associated with a plurality of word lines coupled to said plurality of memory cells;

a plurality of word drive decoders which each generate a complementary word line driving signal and a non-complementary word line driving signal; and a plurality of word line drivers which are respectively coupled to said plurality of word lines and which form first and second word line driver groups, said plurality of word line drivers arranged so that said plurality of memory cells are formed between said first and second word line driver groups, each of said first and second word line driver groups inputting said single row decoding signal output from said row decoder and certain of said complementary word line driving signals and said non-complementary word line driving signals from certain of said plurality of word drive decoders and generating memory cell select signals along some of said plurality of word lines.

2. The word line decoding circuit according to claim 1, wherein said single row decoding signal output from said row decoder is provided to each of said plurality of word line drivers.

3. The word line decoding circuit according to claim 1, wherein each of said first and second word line driver groups includes:
- a plurality of PMOS transistors, each PMOS transistor associated with one of said word lines and having a gate which inputs said row decoding signal, a source terminal which inputs one of said complementary word line driving signal and said non-complementary word line driving signal and a drain terminal;
- a first plurality of NMOS transistors, each NMOS transistor of said first plurality associated with one of said word lines and having a gate which inputs said row decoding signal and a drain terminal which connects at an output node to a respective one of said PMOS transistor drain terminals, said output node being connected to one of said plurality of word lines; and
- a second plurality of NMOS transistors, each NMOS transistor of said second plurality associated with one of said word lines and having a gate which inputs another one of said complementary word line driving signal and said non-complementary word line driving signal and a drain terminal which connects at said output node to a respective one of said PMOS transistor drain terminals.

4. The word line decoding circuit according to claim 1 wherein said plurality of word lines includes four word lines, said four word lines associated with said output line.

5. The word line decoding circuit according to claim 1 wherein each of said complementary word line driving signals and said non-complementary word line driving signals are transmitted along a decoder output line that is substantially perpendicular to said output line.

6. A word line decoding circuit of an integrated semiconductor memory device including a plurality of memory cells for storing information, said word line decoding circuit comprising:
- a row decoder that decodes an external address and generates a single row decoding signal, said single row decoding signal being transmitted along an output line which contains a metallic portion and a strap, said output line associated with a plurality of at least four word lines coupled to said plurality of memory cells;
- a plurality of word drive decoders which each generate a complementary word line driving signal and a non-complementary word line driving signal; and
- a plurality of word line drivers which are respectively coupled to said plurality of word lines and which form first and second word line driver groups, said plurality of word line drivers arranged so that said plurality of memory cells are formed between said first and second word line driver groups, each of said word line drivers inputting said single row decoding signal output from said row decoder and said complementary word line driving signal and said non-complementary word line driving signal from one of said plurality of word drive decoders and generating a memory cell select signal along one of said plurality of word lines.

7. The word line decoding circuit according to claim 6, wherein each of said word line drivers includes:
- a PMOS transistor associated with one of said word lines and having a gate which inputs said row decoding signal, a source terminal which inputs one of said complementary word line driving signal and said non-complementary word line driving signal and a drain terminal;
- a first NMOS transistor associated with said one of said word line and having a gate which inputs said row decoding signal and a drain terminal which connects at an output node to said PMOS transistor drain terminal, said output node being connected to one of said plurality of word lines; and
- a second NMOS transistor associated with said one of said word line and having a gate which inputs another one of said complementary word line driving signal and said non-complementary word line driving signal and a drain terminal which connects at said output node to said PMOS transistor drain terminal.

8. The word line decoding circuit according to claim 6 wherein each of said complementary word line driving signals and said non-complementary word line driving signals are transmitted along a decoder output line that is substantially perpendicular to said output line.

9. The word line decoding circuit according to claim 7 wherein each of said complementary word line driving signals and said non-complementary word line driving signals are transmitted along a decoder output line that is substantially perpendicular to said output line.

10. A word line decoding circuit of an integrated semiconductor memory device including a plurality of memory cells for storing information, said word line decoding circuit comprising:
- a row decoder that decodes an external address and generates a single row decoding signal, said single row decoding signal being transmitted along an output line which contains a metallic portion and a strap, said output line associated with a plurality of at least four word lines coupled to said plurality of memory cells;
- a plurality of word drive decoders which each generate a word line driving signal; and
- a plurality of word line drivers which are respectively coupled to said plurality of word lines and which form first and second word line driver groups, said plurality of word line drivers arranged so that said plurality of memory cells are formed between said first and second word line driver groups, each of said first and second word line driver groups inputting said single row decoding signal output from said row decoder and certain of said word line driving signals from certain of said plurality of word drive decoders and generating memory cell select signals along some of said plurality of word lines.

11. The word line decoding circuit according to claim 10, wherein said single row decoding signal output from said row decoder is provided to each of said plurality of word line drivers.

12. The word line decoding circuit according to claim 1 wherein said word line driving signals are transmitted along decoder output lines that are substantially perpendicular to said output line.

13. A word line decoding circuit of an integrated semiconductor memory device including a plurality of memory cells formed in a memory cell area, a first strap area adjacent one side of said memory cell area, and a second strap area adjacent a side opposite said one side of said memory cell area, said word line decoding circuit comprising:
- a row decoder that decodes an external address and generates a single row decoding signal, said single row decoding signal being transmitted along an output line having a metallic portion formed over said memory cell area, and straps formed in said first and second strap area, said output line associated with a plurality of at least four word lines coupled to said plurality of memory cells;

a plurality of word drive decoders which each generate a complementary word line driving signal and a non-complementary word line driving signal; and a plurality of word line drivers which form first and second word line driver groups, said first driver group arranged adjacent said first strap area, and said second driver group arranged adjacent said second strap area, so that said plurality of memory cells are formed between said first and second word line driver groups, each of said word line drivers inputting said single row decoding signal output from said row decoder and said complementary word line driving signal and said non-complementary word line driving signal from one of said plurality of word drive decoders and generating a memory cell select signal along one of said plurality of word lines.

* * * * *